(12) United States Patent
Kokubun

(10) Patent No.: US 7,376,931 B2
(45) Date of Patent: May 20, 2008

(54) METHOD FOR PROVIDING LAYOUT DESIGN AND PHOTO MASK

(75) Inventor: Tetsuya Kokubun, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 431 days.

(21) Appl. No.: 11/016,762

(22) Filed: Dec. 21, 2004

(65) Prior Publication Data
US 2005/0138598 A1    Jun. 23, 2005

(30) Foreign Application Priority Data
Dec. 22, 2003    (JP) ............................ 2003-424914

(51) Int. Cl.
*G06F 17/50*    (2006.01)
(52) U.S. Cl. ......................................... 716/21; 716/10
(58) Field of Classification Search ................. None
See application file for complete search history.

(56) References Cited

U.S. PATENT DOCUMENTS

| | | | |
|---|---|---|---|
| 6,795,956 B2 * | 9/2004 | Hokari .......................... | 716/10 |
| 6,838,216 B2 * | 1/2005 | Griesinger et al. ............ | 430/5 |
| 6,839,890 B2 * | 1/2005 | Sugita et al. ................. | 716/19 |
| 6,964,032 B2 * | 11/2005 | Liebmann et al. ............ | 716/19 |
| 7,107,573 B2 * | 9/2006 | Yamazoe et al. ............. | 716/21 |
| 2002/0177050 A1 * | 11/2002 | Tanaka .......................... | 430/5 |

FOREIGN PATENT DOCUMENTS

JP    11-135402    5/1999

* cited by examiner

*Primary Examiner*—Leigh Marie Garbowski
(74) *Attorney, Agent, or Firm*—Young & Thompson

(57)    ABSTRACT

A method for providing the layout design of semiconductor integrated circuit that is capable of promoting the reduction of the circuit pattern area is provided. A hole pattern is disposed at the mesh point which is an intersecting point of mutually orthogonal virtual grid lines and another hole pattern is not disposed at the adjacent mesh point that is the closed mesh point having the hole pattern thereon.

16 Claims, 6 Drawing Sheets

PRIOR ART

PRIOR ART

METHOD FOR PROVIDING LAYOUT DESIGN AND PHOTO MASK

The present application is based on Japanese patent application No. 2003-424914, the whole contents of which are herein incorporated by reference.

BACKGROUND OF THE INVENTION

1. Field of the Invention

The present invention relates to a method for providing a layout design and a photo mask.

2. Related Art

Layout designs for providing patterns such as contact holes, interconnects or the like of a semiconductor integrated circuit depends upon types of circuits. In a large scale integrated circuit of the standard cell design having a plurality of predetermined logic circuits disposed thereon as unit circuits, a layout design technique of arranging hole patterns of contact holes, via holes and the like at mesh points of orthogonally intersecting virtual grid is employed. The reasons for disposing the hole patterns at the mesh points generally include two reasons.

One reason is that the technique is suitable to be adopted for the automated interconnect layout tool that utilizes a computer aided design (CAD). The interconnects can easily be disposed as originally designed by the circuit utilizing CAD, which executes the processing according to a precedently stored computer program by disposing the cells, the patterned interconnects and the hole patterns at the mesh points designed in accordance with the circuit design.

Another reason is that the technique is to be adopted to a photolithography. The hole patterns are disposed in an array-shape on mesh points, which are intersecting points of the virtual grid having even intervals, when the hole patterns are arranged, so that the photo resist can easily be processed by utilizing interference of light emitted from the adjacent hole patterns in the exposure process to have the hole patterns having the target dimension and shape. In addition, even if the hole patterns are not arranged in an array-shape but if the hole patterns are disposed at the mesh points of the virtual grid, an advantage of enabling an easy generation of the correction shape via an optical proximity correction (OPC) can be obtained.

Needs for achieving the miniaturization and the increased integration of the semiconductor integrated circuits are growing in recent years, and in order to meet the needs, it is recognized that the hole pattern design technique is particularly critical for the photolithography, and the technology of combining a manner of disposing respective hole patterns to points of the virtual grid with a modified illumination method or an use of a phase shift mask is proposed (see, for example, Japanese Patent Laid-Open No. H11-135,402 (1999)).

Next, a layout of a primitive cell that is an unit circuit of a standard cell of a semiconductor integrated circuit will be described.

FIG. 5 is a schematic diagram, showing a layout pattern of a configuration of a primitive cell in a conventional technology. FIG. 5 shows a case of a dual-input NAND gate. This diagram of the primitive cell illustrates the case of dual-input NAND gate having N-type metal oxide semiconductor (MOS) transistor and P-type MOS transistor. Hereinafter, the MOS transistor is merely referred to as "transistor" in the description. In addition, N-type well, P-type well, and N-type diffusion layer and P-type diffusion layer for fixing the well voltages are not illustrated in the figure.

A primitive cell shown in FIG. 5 comprises respective patterns of: a N-type diffusion layer 4 for forming a source region and a drain region of a N-type transistor; a P-type diffusion layer 5 for forming a source region and a drain region of a P-type transistor; a gate electrode 6 of transistor; and a metal interconnect 2 for providing an electrical coupling between devices. A virtual grid 1 generally employed in the typical layout design is designed to have a grid-shape in this layout pattern. Contact holes 3 are arranged on mesh points, which are intersecting points of the orthogonally intersecting lines of the virtual grid 1.

Here, a numeral number 7 indicates a cell bound showing a boundary between the adjacent cells. Hereinafter, an interval of the virtual grid 1 is referred to as a virtual grid size, and a size of n folds of the virtual grid size (n is an integer number) is referred to as a n-virtual grid size.

As shown in FIG. 5, the center-distance between the contact holes 3 that are adjacent across the gate electrode 6 of the P-type transistor is set to the size of the virtual grid. The reason will be described as follows.

Assume that, for example, the size of the contact hole 3 is 0.09 μm×0.09 μm. And concerning the resolution limit pitch, which is the minimum pitch of the resolution limit in an exposure process for semiconductor integrated circuit, assume that the resolution limit pitch of the contact hole 3 is, for example, 0.18 μm. In such case, when the size of the virtual grid is set to 0.18 μm, which is equivalent to the pitch of the resolution limit for the contact hole 3, it is difficult to arrange the contact holes 3 to be mutually adjacent across the gate electrode 6 for ensuring the clearance between the gate electrode 6 and the contact hole 3. When the contact holes are arranged on every other grids with the interval thereof of two meshes of the virtual grid, the contact holes 3 arranged in a relationship of mutually adjacent across the gate electrode 6 are arranged with intervals of 0.36 μm, thereby increasing the flexibility for the layout reference to promote providing larger area thereof. Therefore, as shown in FIG. 5, the contact holes 3 being mutually adjacent across gate electrode 6 may be arranged with a minimum interval that satisfies the associated multiple design reference (for example, 0.27 μm), and the interval between the contact holes 3 can be employed as the virtual grid size to effectively provide reduced cell size.

Next, the photo mask for the exposure process of the contact holes 3 of the primitive cell shown in FIG. 5 will be described.

FIG. 6 is a schematic diagram, showing the photo mask for the exposure process of the contact holes. Here, contact holes 3 shown in FIG. 5 are indicated with numeral number 11 on the photo mask 29.

As shown in the photo mask 29 of FIG. 6, contact holes 11 are arranged at mesh points of the virtual grid 10. In addition, supplementary patterns 12, which are smaller in size than the contact holes 11, are disposed at the mesh points, which are free of the contact holes 11. The size of the supplementary pattern 12 is set to a size that does not provide an opening in the photo resist formed on the wafer by the exposure process for the photo resist, or in other word, a size of being smaller than the resolution limit. In this case, the virtual grid 10 is not formed on the actual photo mask.

Next, the effects obtained by providing the supplementary patterns 12 will be described.

When the contact holes 11 are formed in the photo resist by employing the photo mask that is free of the supplementary pattern 12, the exposure process is conducted under a condition that is suitable for isolated holes, which are contact holes 11 having no adjacent hole of the hole patterns, to form an opening in the isolated holes in the photo resist having an opening size as designed.

However, a size of crowded holes, which have adjacent holes of the hole patterns at all adjacent mesh points, is larger than the targeted size. On the contrary, when the exposure process is conducted under a condition that is adjusted to be suitable for the crowded holes, the opening size of the isolation hole in the photo resist is smaller than the targeted size.

On the other hand, when the supplementary patterns 12 are provided thereon, the optical conditions for the respective holes in the diagrams of the layout pattern shown in FIG. 6 are uniform. Therefore, dimensional change due to a difference in the pattern coarseness and minuteness (proximity effect) is reduced. The reduced proximity effect provides reduced difference in dimensions between the isolated hole and the crowded hole, and thus this results in increasing the flexibility in the required dimension for suitably focusing, thereby promoting the formation of the hole patterns in easier way.

The size of the virtual grid in prior art is set to a dimension that is equal to or larger than the limit interval for providing a resolution to the adjacent contact holes. Alternatively, the size of the virtual grid in prior art may be determined by the other limitations in the design rules than that related to the contact hole, even though the size of the virtual grid is equal to or larger than the pitch for providing a resolution limit. It can be decided by constraint on other design reference except contact hole. Further, in the case of the primitive cell in the standard cell design stated above, the center-distance of the contact holes, which are mutually adjacent across the gate electrode of the transistor, is ordinarily set to the virtual grid size.

SUMMARY OF THE INVENTION

However, when all the contact holes are arranged at the mesh points of the virtual grid in the design technique of the prior art, the contact hole intervals are more opened than required depending on the position, and the placements of the gate electrode, the diffusion layer and the metal interconnect coupled to contact holes are more coarse than required, so that the cell area may be increased in comparison with the case, in which the contact holes are freely disposed. A specific example will be described as follows.

For example, an arrangement of the virtual grid shown in FIG. 5 in the transverse direction is defined as a X direction virtual grid and the arrangement in the longitudinal direction is defined as a Y direction virtual grid, and the contact holes on gate electrode and the contact holes on the diffusion layer are disposed on the same line of X direction virtual grid in the primitive cell shown in FIG. 5. The resultant layout thereof has metal interconnects in vicinity of the contact holes on the gate electrode, which are considerably deviated in the transverse direction. Since the cell size is composed of integer-number folds of the virtual grid size, the cells include wasteful spaces as indicated by cell bounds 7 in FIG. 5. The increase of area of such primitive cell, in turn, leads to an increase of size and area of the whole chip.

According to one aspect of the present invention, there is provided a method for providing a layout design for a semiconductor integrated circuit, wherein a hole pattern is disposed at a mesh point of orthogonally intersecting virtual grid, and wherein an adjacent mesh point is free of another hole pattern, the adjacent mesh point being mostly closed to a hole mesh point having the hole pattern thereon.

According to another aspect of the present invention, there is provided a photo mask employed for an exposure process for the semiconductor integrated circuit that is designed by the above-described method for providing the layout design thereof, wherein a hole pattern is disposed at a hole mesh point of the virtual grid on the photo mask, and wherein a supplementary pattern is disposed at some of the mesh points having no hole pattern thereon, the supplementary pattern having sufficiently smaller dimension such that the pattern thereof is not transferred to the photo resist.

According to further aspect of the present invention, there is provided a method for providing a layout design for a semiconductor integrated circuit, comprising: disposing a hole pattern at a mesh point, which is an intersecting point of mutually orthogonal virtual grid lines, wherein an interval of one of arrays disposed along the virtual grid lines in mutually orthogonal two directions is smaller than a resolution limit pitch of an exposure process for the semiconductor device and an interval of the other array thereof is a size equal to or larger than the resolution limit pitch, and wherein, when the hole pattern is disposed at a mesh point of the virtual grid, concerning the direction along the array having the interval smaller than the resolution limit pitch, no hole pattern is disposed at an adjacent mesh point that is the mostly closed to the mesh point having the hole pattern thereon.

According to yet other aspect of the present invention, there is provided a photo mask employed for an exposure process for the semiconductor integrated circuit that is designed by the above-described method for providing the layout design thereof, wherein a hole pattern is disposed at a hole mesh point of the virtual grid on the photo mask, and wherein a supplementary pattern is disposed at some of the mesh points having no hole pattern thereon, the supplementary pattern having smaller dimension such that the pattern thereof is not transferred to the photo resist.

In the present invention, the arrangement of the hole patterns and the manufacture of the photo mask are conducted by either one of the above-described methods for providing the layout design. Thus, the area of the chip in the semiconductor integrated circuit manufactured by employing this photo mask can be smaller than the conventional chip. Therefore, the entire area of the pattern can be reduced, while maintaining the advantageous effect obtainable by disposing the hole patterns at the mesh points of the virtual grid.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
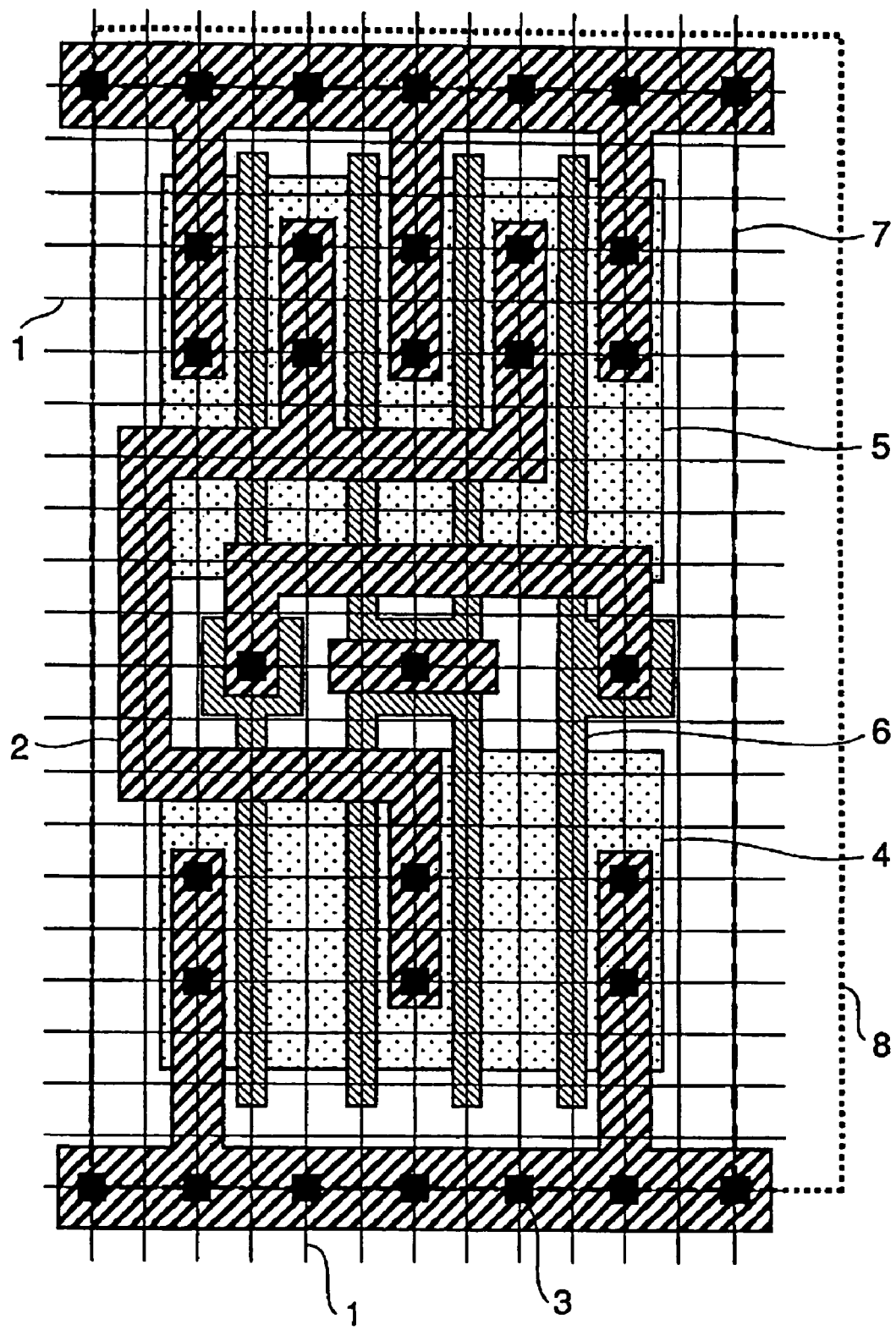
FIG. 1 is a schematic diagram, showing a layout pattern of a primitive cell designed by layout design technique of first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In the above-described method for providing the layout design method according to the present invention, the mesh size of the virtual grid may be smaller than the resolution limit pitch for the hole patterns in exposure process for the semiconductor integrated circuit.

The photo mask of the above-described present invention may also comprise a configuration, in which a mesh point that is not an adjacent mesh point has the supplementary pattern thereon, the adjacent mesh point being closest to the mesh point having the hole pattern thereon.

The photo mask of the above-described present invention may also comprise a configuration, in which an adjacent mesh point is free of other supplementary pattern, the adjacent mesh point being closest to the mesh point having the supplementary pattern thereon.

The photo mask of the above-described present invention may also comprise a configuration, in which an adjacent mesh point is free of other supplementary pattern, the adjacent mesh point being mostly closed to a mesh point having a supplementary pattern thereon, the supplementary pattern being disposed at a position that is away from a hole mesh point having the hole pattern thereon by a distance equivalent to integer-number folds of a closest pitch, the closest pitch being a minimum pitch for disposing the hole pattern.

The photo mask of the above-described present invention may further comprise a configuration, in which a mesh point within circles other than the hole mesh point having the hole pattern thereon and except the mesh point having the supplementary pattern thereon is free of supplementary pattern, the circles having a center at the hole mesh point or at a mesh point having the supplementary pattern thereon and having a radius being equivalent to a closest pitch, the closest pitch is a minimum pitch for disposing the holes.

The photo mask of the above-described present invention may also comprise a configuration, in which, in the virtual grid on the photo mask, the hole pattern is disposed at a mesh point of the virtual grid, and wherein, concerning the direction along the array having the interval smaller than the resolution limit pitch, no supplementary pattern is disposed at an adjacent mesh point that is the closest to the mesh point having the hole pattern thereon.

The photo mask of the above-described present invention may further comprise a configuration, in which, in the virtual grid on the photo mask, the supplementary pattern is disposed at a mesh point of the virtual grid, and wherein, concerning the direction along the array having the interval smaller than the resolution limit pitch, no supplementary pattern is disposed at an adjacent mesh point that is the closest to the mesh point having the supplementary pattern thereon.

In the method for providing a layout design for a semiconductor integrated circuit according to the present invention, the virtual grid is designed to have a mesh width, which is smaller than the resolution limit pitch that is the smallest pitch of the resolution limit for the exposure process, hole patterns are disposed at the mesh points, which are the intersecting points of lines of the virtual grid, and adjacent mesh points, which are the closest mesh points from a hole pattern, are free of another hole pattern.

First Embodiment

Configurations of the present invention will be described.

FIG. 1 is a schematic diagram, showing a layout pattern of an example of a primitive cell according to a method for providing layout design of the present invention. FIG. 1 shows a case of a dual-input NAND gate.

As shown in FIG. 1, similarly as in the conventional configuration, a primitive cell has a P-type transistor and a N-type transistor, and respective contact holes 3 are disposed on mesh points of a virtual grid 1 having mutually orthogonal lines.

In the present embodiment, a virtual grid size, which is defined as a mesh size of the virtual grid, is smaller than the resolution limit pitch for the contact holes 3. In addition, two folds of the virtual grid size is equal to or larger than the resolution limit pitch. While the contact holes are disposed at the mesh points of the virtual grid 1, when a specific hole of the hole patterns is considered, the most adjacent mesh point thereof is free of another hole pattern.

As shown in FIG. 1, the dimension between the mesh points of contact holes 3, which are mutually adjacent across the gate electrode 6 of P-type transistor, is two folds of the mesh size of the virtual grid. This size of two folds of the mesh size corresponds to the minimum pitch among dimensions between the mesh points of contact holes 3. The minimum pitch of the contact hole 3 is hereinafter referred to as a closest pitch.

Next, the photo mask for the exposure process for the contact holes 3 of the primitive cell shown in FIG. 1 will be described.

Figure 2:
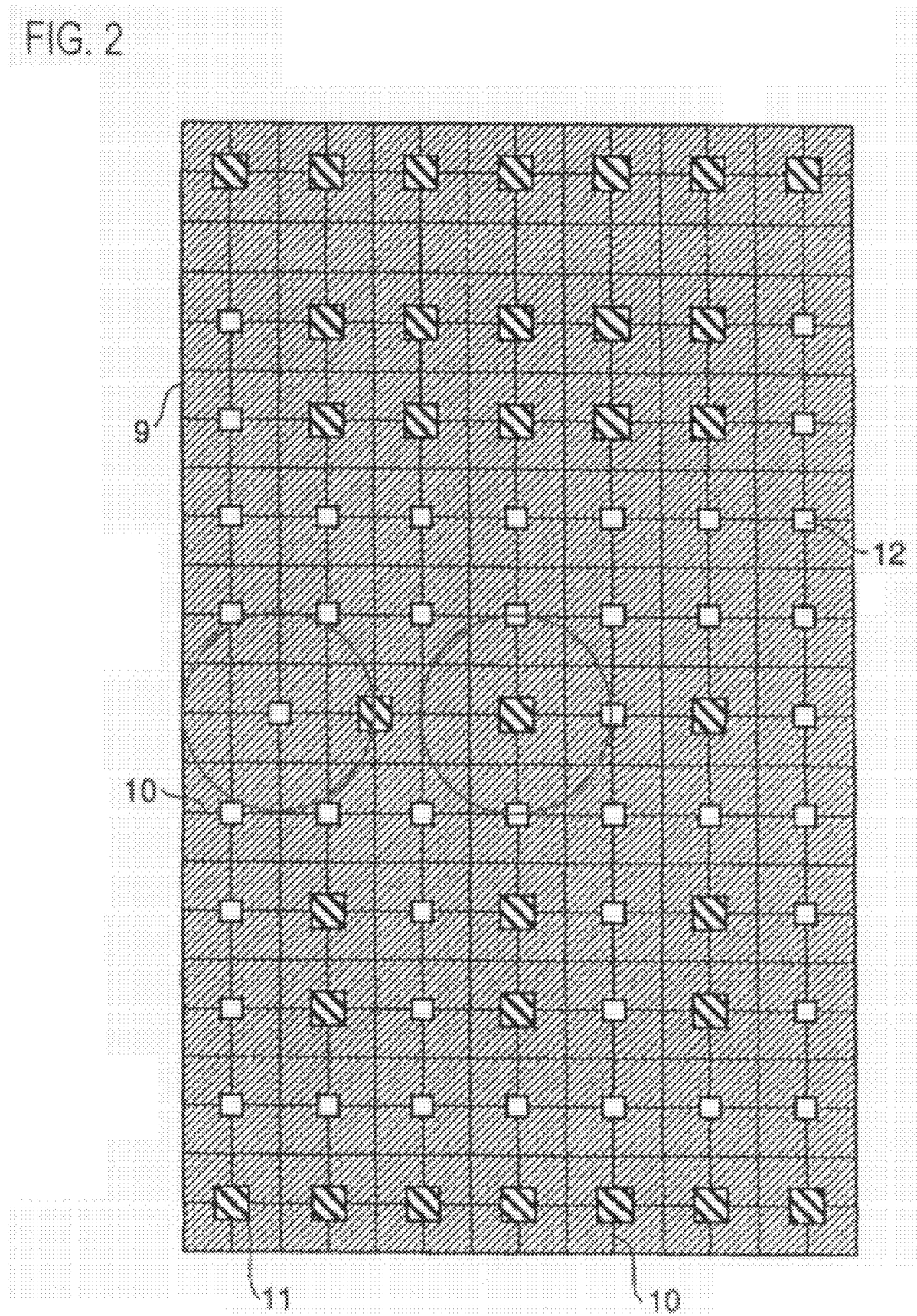
FIG. 2 is a schematic diagram, showing a photo mask for the exposure process for the contact holes corresponding to the layout pattern shown in FIG. 1.

FIG. 2 is a schematic diagram, showing the photo mask for the use in the exposure process for the contact holes. Similarly as in the conventional process, the contact holes 3 shown in FIG. 1 are indicated by numeral 11 on the photo mask 9.

Contact holes 11 are disposed at mesh points in the virtual grid 10 on the photo mask 9, similarly as in the conventional configuration. Then, similarly as described in reference with FIG. 1, the virtual grid size is smaller than the resolution limit pitch for the contact holes 11 in the present embodiment, and the dimension that is equivalent to two folds of the virtual grid size is equal to or larger than the resolution limit pitch. Here, the virtual grid 10 is not formed in the real photo mask.

Some of the mesh points, which are free of the contact holes 11 disposed thereon, have supplementary patterns 12 disposed thereon having a size being smaller than the size of the contact hole 11. The size of the supplementary pattern 12 is provided so that no opening is created in a photo resist formed on the wafer during the exposure process for the photo resist, and in other words, the size thereof is set to be smaller than the resolution limit. Further, as shown in FIG. 2, adjacent mesh points, which are closest to either of the mesh points having the contact holes 11 thereon and the mesh points having the supplementary patterns 12 thereon, are free of the contact hole 11 and the supplementary pattern 12. In this way, the configuration contains the mesh points, which are free of either the contact hole 11 or the supplementary pattern 12, since, unlike the case of the prior art, the virtual grid mesh size is smaller than the resolution limit pitch for contact hole 11, and thus it is not realistic to dispose the supplementary pattern 12 at all the mesh points having no contact hole 11 thereon. In addition, another reason is to ensure the suitable optical conditions in the exposure process at a level equivalent to the conditions in the conventional process.

In addition, the present embodiment employs the configuration, in which an adjacent mesh point that is closest to a mesh point having the supplementary pattern 12 thereon is free of other supplementary pattern 12, which is disposed at a position that is away from a hole mesh point having the hole of the hole patterns 11 thereon by a distance equivalent to integer-number folds of the closest pitch. Therefore, the density of the openings in the pattern can be more uniform, and thus the optical conditions for the exposure process is further improved.

Further, the present embodiment employs the configuration, in which a mesh point within circles other than the hole mesh point having the hole pattern 11 thereon and other than the mesh point having the supplementary pattern 12 thereon is free of supplementary pattern 12, the circles having a center at the hole mesh point having the hole pattern 11 thereon or at a mesh point having the supplementary pattern 12 thereon and having a radius being equivalent to the closest pitch. Having this configuration, in the minimum quadrangles composed of the virtual grid having each hole or supplementary patterns at apexes, no supplementary patterns are disposed at diagonally opposing apexes of the quadrangles, thereby providing improved uniformity in the opening density.

In the above-described method for providing the layout design, while all of the contact holes 11 and the supplementary patterns 12 are not completely regularly lined, no supplementary pattern 12 is not disposed at the points, around which the contact holes 11 are disposed at higher density. In addition, the supplementary patterns 12 are arranged with the interval of two folds of the virtual grid size at the location where contact hole 11 is disposed alone, resulting in that the supplementary patterns 12 are interpositioned therebetween with suitable intervals, and thus the resolution and the flexibility in the required dimension for suitably focusing in exposure are maintained at the level same as in the prior art.

Next, the area reduction rate of the cell area obtainable by the method for providing the layout design according to the present embodiment against the conventional cell area will be described. It is assumed that an ArF stepper (light source wave length: 193 nm) is employed here. In addition, it is also assumed that the size of the contact hole is 0.09 μm×0.09 μm and the resolution limit pitch for the contact holes is 0.18 μm.

Figure 5:
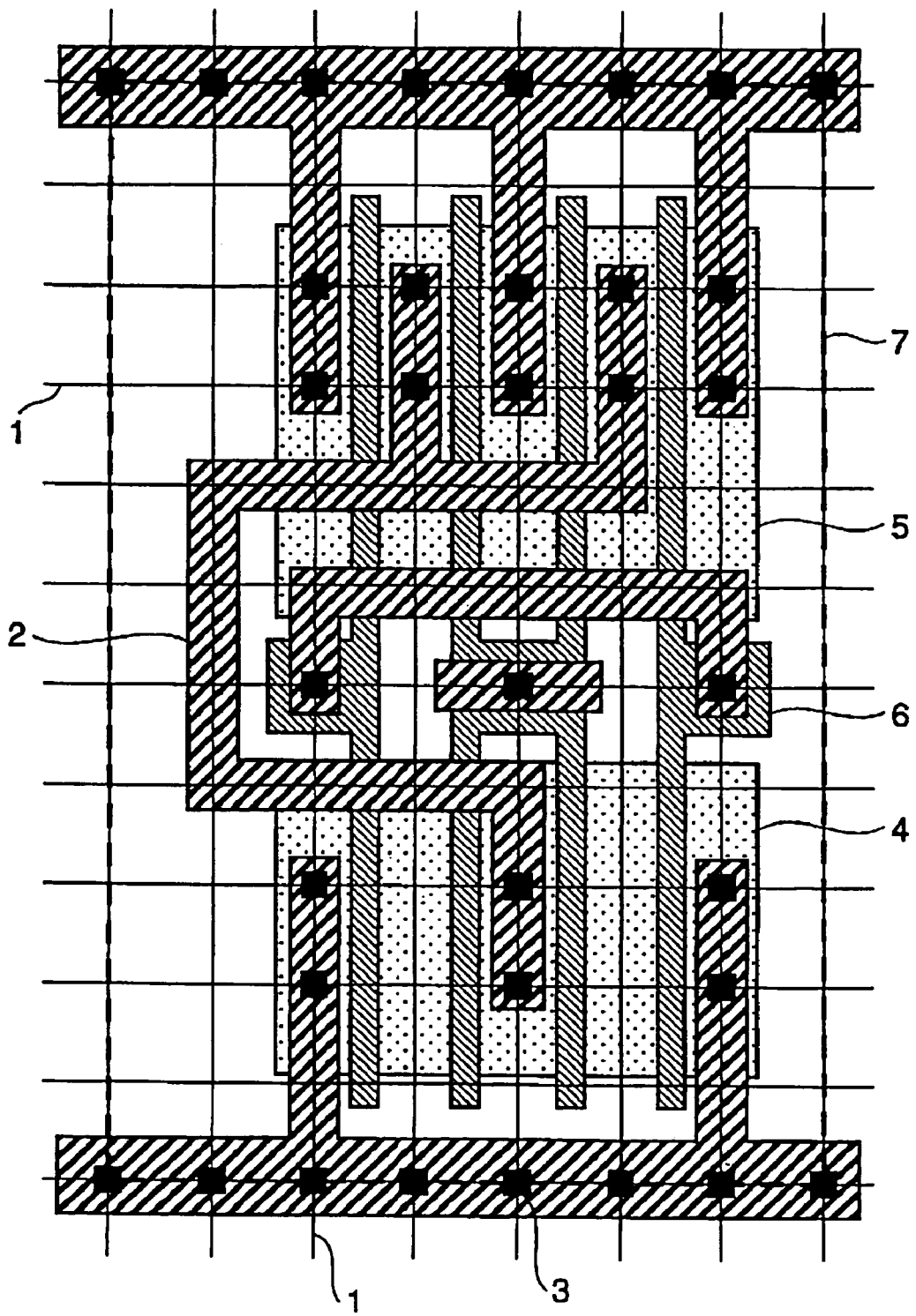
FIG. 5 is a schematic diagram, showing a layout pattern of a primitive cell designed by a conventional layout design technique.
Figure 6:
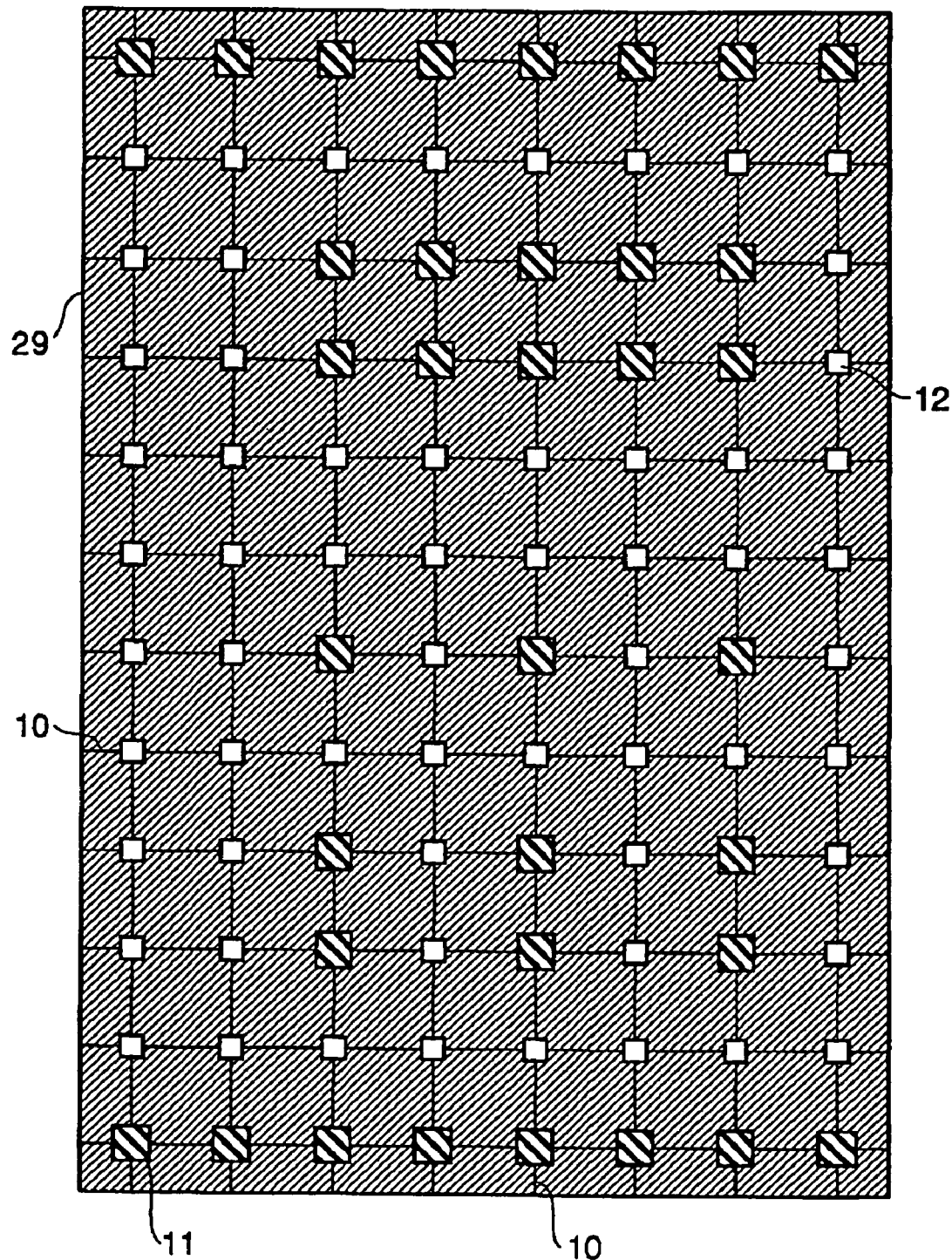
FIG. 6 is a schematic diagram, showing a photo mask for an exposure process of contact holes corresponding to the layout pattern shown in FIG. 5.

In the virtual grid having the configuration of the prior art shown in FIG. 5, the virtual grid size is set to be equivalent to the interval of the contact holes 3 that are mutually adjacent across the gate electrode 6. Assume that the interval is 0.27 μm, the area of the dual-input NAND gate cell is presented as: (0.27 μm×7 folds of the virtual grid size)×(0.27 μm×11 folds of the virtual grid size)=5.61 μm².

On the contrary, when the method for providing the layout design according to the present embodiment is employed, it is sufficient if the two folds of the virtual grid size is equal to or larger than the resolution limit pitch of, in this case, 0.18 μm, and thus a virtual grid size can be set to, for example, 0.135 μm. Assume that the virtual grid size for the dual-input NAND gate shown in FIG. 1 is 0.135 μm, even if the interval of the contact holes that are mutually adjacent across the gate electrode 6 is 0.27 μm, which is the same as the interval in the conventional case (0.135 μm×2 folds of the virtual grid size), area of the cell is: (0.135 μm×12 folds of the virtual grid size)×(0.135 μm×21 folds of the virtual grid size)=4.59 μm², and thus about 18% of reduction of the area can be achieved in comparison with the conventional case. In order to promote clearly illustrating the difference in area of the cell between the conventional approach and the present invention, the conventional cell boundary 8 in the case of the dual-input NAND gate shown in FIG. 5 is also illustrated in FIG. 1.

Area of the cell and, in turn, area of the chip can be reduced by employing a method for providing the layout design of the present invention.

Since the photo mask manufactured by the method for providing the layout design of the present invention provides the substantially uniform optical conditions for the respective contact holes, the resolution for all of the contact holes can be achieved with an uniform dimension. In addition, since the virtual grid size in the method for providing the layout design according to the present invention is smaller than the pitch of the resolution limit for the contact hole in the design for the arrangement of the contact holes, the flexibility for the arrangement of the contact holes is increased in comparison with the prior art, resulting that the useless spaces in the cell can be eliminated to reduce the entire area of the cell.

While the contact holes in the primitive cell are illustrated in the present embodiment, the arrangement of the via holes and the manufacture of the photo mask can similarly be conducted under the condition of "not to dispose via holes on the most adjacent virtual grid point" to improve the degrees of flexibility for arranging the via holes, thereby achieving the reduction of area.

In addition, while the virtual grid size is set to the value of a half of the resolution limit pitch for the contact holes, the virtual grid size may be a value obtained by dividing the resolution limit pitch by a value larger than two. When the resolution limit pitch for the contact hole is divided by n (n is an integer number), the virtual grid size is smaller than the resolution limit pitch for the contact holes, and thus n-virtual grid size is equal to or larger than the resolution limit pitch.

Second Embodiment

The present embodiment is characterized in that the virtual grid size along the X direction of the transverse direction in the virtual grid shown in FIG. 1 in the first embodiment is different from that along the Y direction of a longitudinal direction.

Configuration of the present embodiment will be described. Similar numeral is assigned to a similar element appeared in the first embodiment, and the detailed description thereof is not presented.

Figure 3:
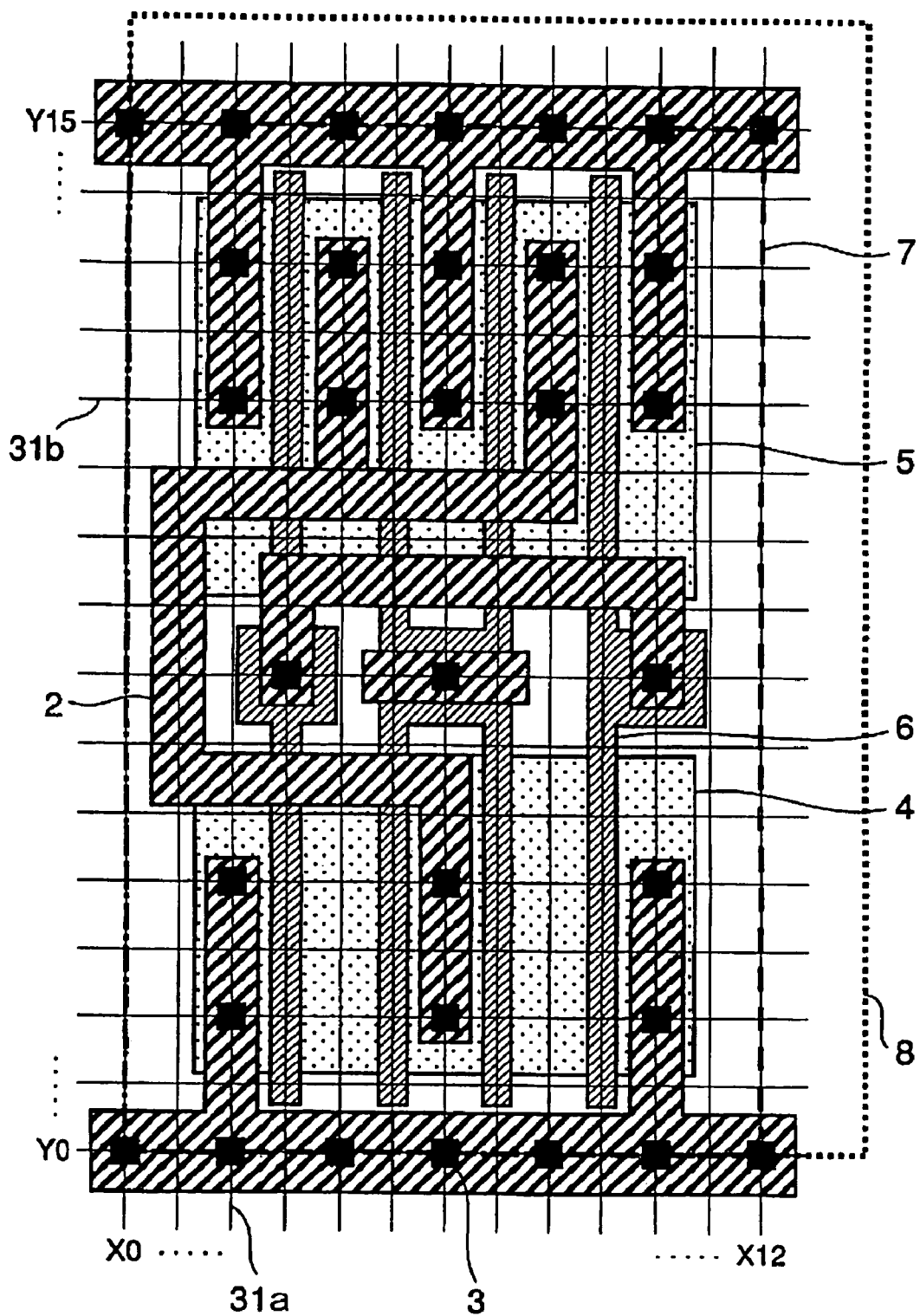
FIG. 3 is a schematic diagram, showing a layout pattern of the primitive cell designed by the layout design technique of second embodiment.

FIG. 3 is schematic diagram, showing the layout pattern of a primitive cell obtained by a method for providing the layout design according to the present embodiment. FIG. 3 shows a case of the dual-input NAND gate, similarly as in the first embodiment.

X-direction virtual grid 31a in FIG. 3 comprises grid lines of X0 to X12 and Y-direction virtual grid 31b comprises grid lines of Y0~Y15. The virtual grid size in X direction is smaller than the resolution limit pitch for the contact holes 11, similarly as in the first embodiment, and two-folds of the virtual grid size in X direction is equal to or larger than the resolution limit pitch. On the contrary, the virtual grid size in Y direction is set to a size being equal to or larger than the resolution limit pitch. As such, the virtual grid sizes are different by the direction of X direction and Y direction.

Next, the area reduction rate of the cell area obtainable by the method for providing the layout design according to the present embodiment against the conventional cell area will be described. Here, conditions of light source wave length, size of the contact hole, the resolution limit or the like are similar as in the first embodiment.

In FIG. 3, the virtual grid size in X direction is set to 0.135 μm, and the virtual grid size in Y direction is set to 0.18 μm, which is equivalent to the resolution limit pitch. Having such configuration, the interval between the contact hole on the diffusion layer of the source electrode and the drain electrode of the transistor and the contact hole for fixing the well voltage located in the upper and the lower edges of the cell is optimized, thereby providing further reduction of the area thereof, as compared with the case of the first embodiment.

In the cell shown in FIG. 3, area of the cell is: (0.135 μm×12 folds of the virtual grid size)×(0.18 μm×15 folds of the virtual grid size)=4.37 μm$^2$, and thus about 22% of reduction in the area can be achieved in comparison with the conventional case. In order to promote illustrating the difference of cell areas between the conventional approach and the present invention, the conventional cell boundary 8 in case of the dual-input NAND gate shown in FIG. 5 is also illustrated in FIG. 3. The flexibility for arranging the contact holes is further improved and the cell area can further be reduced by employing the virtual grid having grid sizes that are different by the X Y directions.

The photo mask for the contact holes having the aforementioned dimension (virtual grid size=0.135 μm in X direction, virtual grid size=0.18 μm in Y direction) will be described.

Figure 4:
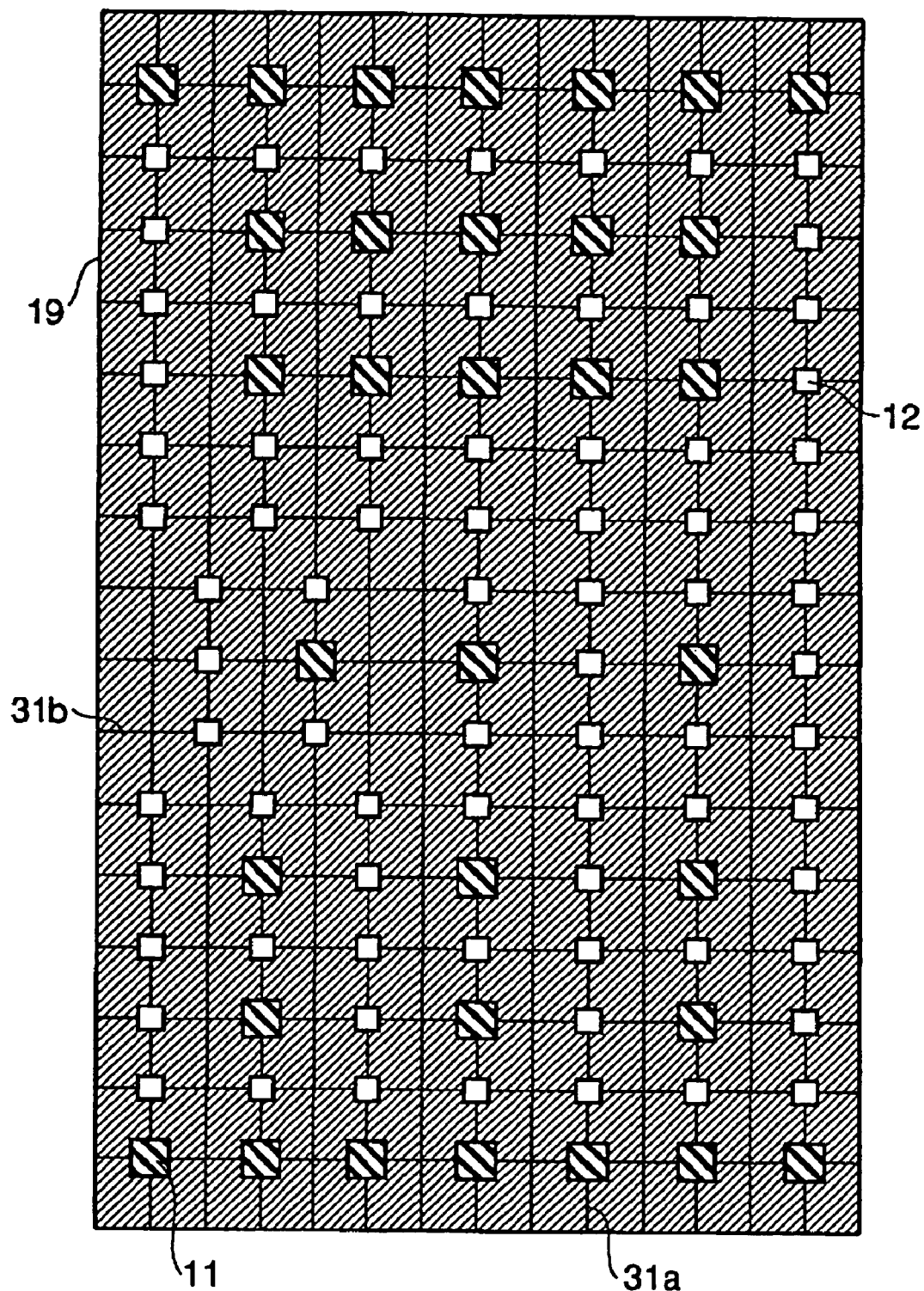
FIG. 4 is a schematic diagram, showing a photo mask for an exposure process for contact holes corresponding to the layout pattern shown in FIG. 3.

FIG. 4 is a schematic diagram, showing a photo mask employed for an exposure process for contact holes. The contact holes 3 shown in FIG. 3 are indicated by a numeral 11 on the photo mask 19. Here, the X direction virtual grid line 31a and the Y direction virtual grid 31b line are not formed on the real photo mask.

As shown on the photo mask 19 in FIG. 4, while the virtual grid size in X direction is 0.135 μm (Design dimension) (Generally a dimension in photo mask becomes four times or five times of the dimension in wafer.), which provides a difficulty in arranging the supplementary pattern 12 at the mesh point that is adjacent thereto in X direction, the virtual grid size in Y direction is 0.18 μm (Design dimension) (=resolution limit pitch)(Generally a dimension in photo mask becomes four times or five times of the dimension in wafer.), which promotes arranging the supplementary pattern 12 at the mesh point that is adjacent thereto in Y direction.

Although some of the mesh points, which are free of the contact holes 11 disposed thereon, have supplementary patterns 12 disposed thereon, similarly as in the first embodiment, the mesh points that are adjacent to the contact hole 11 on the line 31a in X direction are free of the supplementary patterns 12 in the present embodiment. In addition, concerning the arrangement direction of the grid line 31a in X direction, the adjacent mesh point that is adjacent to the supplementary pattern 12 is free of other supplementary pattern 12. Thus, more uniform opening density of the pattern is obtained, and therefore the optical condition for the exposure process is improved.

In the present embodiment, the virtual grid for obtaining the most suitable arrangement of the contact holes that provides the minimum cell size is provided by designing the optimum virtual grid sizes in X direction and Y direction, respectively, corresponding to the situation as mentioned above.

While the contact holes in the primitive cell are illustrated in the present embodiment, the virtual grid having different intervals by XY directions for arranging the via holes may be similarly provided to improve the flexibility for selecting the location of disposing the via holes, thereby reducing the area thereof.

In addition, while the virtual grid size is set to the value of a half of the resolution limit pitch along X direction of the grid, the virtual grid size may be a value obtained by dividing the resolution limit pitch by a value larger than two. When the resolution limit pitch for the contact hole is divided by n (n is an integer number), the virtual grid size in X direction is smaller than the resolution limit pitch for the contact holes, and thus n-virtual grid size is equal to or larger than the resolution limit pitch.

In addition, while the virtual grid size in Y direction is set to a value equivalent to the resolution limit pitch, the size may be larger than the resolution limit pitch. In addition, virtual grid size in Y direction may be similar as that in the first embodiment, and the virtual grid size in X direction may be a size equal to or larger than the resolution limit pitch.

In addition, while the virtual grid sizes are respectively fixed in X direction and Y direction, the different virtual grid sizes are defined for the respective specified regions within the primitive cell and within the chip to improve the flexibility for disposing the holes, as long as the proximity effect occurred during the hole formation process is reduced.

In the above-described first embodiment and the second embodiment, it can be expected that the photo mask containing a supplementary pattern according to the present invention may be exposed to light by a modification lighting employing a ring belt-shaped light source, a four-point light source or the like to enhance the hole resolution. In addition, in the photo mask of the present invention, phase shifters may be disposed in every other hole patterns/supplementary patterns to improve the resolution. Further, suitable optical proximity correction (OPC) may be conducted for the patterned photo mask of the present invention.

It is apparent that the present invention is not limited to the above embodiments that may be further modified and/or changed without departing from the scope and spirit of the present invention.

What is claimed is:

1. A method for providing a layout design for a semiconductor integrated circuit, comprising:
    disposing a hole pattern at a mesh point of orthogonally intersecting virtual grid lines of a virtual grid,
    wherein each adjacent mesh point is free of another hole pattern, said adjacent mesh point being closest to a hole mesh point, said hole mesh point having said hole pattern thereon.

2. The method according to claim 1, wherein a size of a mesh of said virtual grid is smaller than a resolution limit pitch for said hole pattern in an exposure process for said semiconductor integrated circuit.

3. The method according to claim 2, wherein a mesh point within a circle except said hole mesh point having said hole pattern thereon is free of another hole pattern, said circle having a center at said hole mesh point and having a radius being equivalent to a closest pitch, the closest pitch being a minimum pitch for disposing said hole pattern.

4. A photo mask employed for an exposure process for the semiconductor integrated circuit that is designed by the method for providing the layout design thereof according to claim 1,
wherein a hole pattern is disposed at a hole mesh point of the virtual grid on the photo mask, and
wherein a supplementary pattern is disposed at some of the mesh points having no hole pattern thereon, said supplementary pattern having smaller dimension such that the pattern thereof is not transferred to the photo resist.

5. The photo mask according to claim 4, wherein a size of a mesh of said virtual grid is smaller than a resolution limit pitch for said hole pattern in an exposure process for said semiconductor integrated circuit.

6. The photo mask according to claim 5, wherein a mesh point within a circle other than said hole mesh point is free of another hole pattern, said circle having a center at said hole mesh point and having a radius being equivalent to a closest pitch, the closest pitch being a minimum pitch for disposing said hole pattern.

7. The photo mask according to claim 4, wherein a mesh point that is not an adjacent mesh point has said supplementary pattern thereon, said adjacent mesh point being closest to said hole mesh point having said hole pattern thereon.

8. The photo mask according to claim 7, wherein an adjacent mesh point is free of another supplementary pattern, said adjacent mesh point being closest to said mesh point having said supplementary pattern thereon.

9. The photo mask according to claim 8, wherein said adjacent mesh point is free of another supplementary pattern, said adjacent mesh point being closest to a mesh point having a supplementary pattern thereon, said supplementary pattern being disposed at a position that is away from a hole mesh point having said hole pattern thereon by a distance equivalent to integer-number folds of a closest pitch, said closest pitch being a minimum pitch for disposing said hole pattern.

10. The photo mask according to claim 9, wherein a mesh point within circles except said hole mesh point having said hole pattern thereon and except said mesh point having said supplementary pattern thereon is free of said supplementary pattern, one of said circles having a center at said hole mesh point and the other of said circles having a center at a mesh point having said supplementary pattern thereon and both circles having a radius being equivalent to said resolution limit pitch.

11. A method for providing a layout design for a semiconductor integrated circuit, comprising:
disposing a hole pattern at a mesh point, which is an intersecting point of mutually orthogonal virtual grid lines, wherein an interval of one of arrays disposed along the virtual grid lines in mutually orthogonal two directions is smaller than a resolution limit pitch of an exposure process for said semiconductor device and an interval of the other array thereof is a size equal to or larger than said resolution limit pitch, and wherein, when said hole pattern is disposed at a mesh point of said virtual grid, concerning the direction along said array having the interval smaller than said resolution limit pitch, no hole pattern is disposed at an adjacent mesh point that is closest to said mesh point having said hole pattern thereon.

12. The method according to claim 11, wherein a mesh point within a circle other than said hole mesh point having said hole pattern thereon is free of another hole pattern, said circle having a center at said hole mesh point and having a radius being equivalent to a closest pitch, the closest pitch being a minimum pitch for disposing said hole pattern.

13. A photo mask employed for an exposure process for the semiconductor integrated circuit designed by the method for providing the layout design thereof according to claim 11,
wherein a hole pattern is disposed at a hole mesh point of the virtual grid on the photo mask, and
wherein a supplementary pattern is disposed at some of the mesh points having no hole pattern thereon, said supplementary pattern having smaller dimension such that the pattern thereof is not transferred to the photo resist.

14. The photo mask according to claim 13, wherein a mesh point within a circle other than said hole mesh point having said hole pattern thereon is free of another hole pattern, said circle having a center at said hole mesh point and having a radius being equivalent to a closest pitch, the closest pitch being a minimum pitch for disposing said hole pattern.

15. The photo mask according to claim 13,
wherein, in the virtual grid on said photo mask, said hole pattern is disposed at a hole mesh point of said virtual grid, and
wherein, concerning the direction along said array having the interval smaller than said resolution limit pitch, no supplementary pattern is disposed at an adjacent mesh point that is closest to said mesh point having said hole pattern thereon.

16. The photo mask according to claim 15,
wherein, in the virtual grid on said photo mask, said supplementary pattern is disposed at a mesh point of said virtual grid, and
wherein, concerning the direction along said array having the interval smaller than said resolution limit pitch, no supplementary pattern is disposed at an adjacent mesh point that is closest to said mesh point having said supplementary pattern thereon.

* * * * *